United States Patent [19]

Marbot

[11] Patent Number: 5,838,178

[45] Date of Patent: *Nov. 17, 1998

[54] PHASE-LOCKED LOOP AND RESULTING FREQUENCY MULTIPLIER

[75] Inventor: Roland Marbot, Versailles, France

[73] Assignee: Bull S.A., Paris, France

[ * ] Notice: The term of this patent shall not extend beyond the expiration date of Pat. No. 5,260,608.

[21] Appl. No.: 921,334

[22] Filed: Aug. 29, 1997

Related U.S. Application Data

[63] Continuation of Ser. No. 642,652, May 3, 1996, abandoned, which is a continuation of Ser. No. 312,981, Oct. 3, 1994, Pat. No. 5,548,235, which is a continuation of Ser. No. 46,179, Apr. 14, 1993, which is a continuation of Ser. No. 762,018, Sep. 18, 1991, Pat. No. 5,260,608.

[30] Foreign Application Priority Data

Feb. 6, 1990 [FR] France .................................. 90 01366

[51] Int. Cl.$^6$ ...................................................... H03K 5/00
[52] U.S. Cl. .......................... 327/116; 327/119; 327/356; 377/47
[58] Field of Search ..................................... 327/113, 114, 327/116, 119–122, 269, 270, 276; 377/47, 48

[56] References Cited

U.S. PATENT DOCUMENTS

| | | | |
|---|---|---|---|
| 3,587,043 | 6/1971 | Mengani | 371/47.1 |
| 3,992,612 | 11/1976 | Dunn | 377/47 |
| 3,993,957 | 11/1976 | Davenport | 377/47 |
| 4,715,050 | 12/1987 | Tanaka et al. | 375/362 |
| 4,795,985 | 1/1989 | Gailbreath, Jr. | 327/158 |
| 4,873,491 | 10/1989 | Wilkins | 327/280 |
| 4,912,433 | 3/1990 | Motegi et al. | 331/8 |
| 4,922,141 | 5/1990 | Lofgren et al. | 327/158 |
| 5,043,596 | 8/1991 | Masuda et al. | 327/297 |
| 5,079,519 | 1/1992 | Ashby et al. | 331/14 |
| 5,087,829 | 2/1992 | Ishibaihi et al. | 327/152 |
| 5,120,989 | 6/1992 | Johnson et al. | 327/114 |
| 5,204,552 | 4/1993 | Miki | 327/114 |
| 5,216,301 | 6/1993 | Gleeson, III et al. | 327/119 |
| 5,321,734 | 6/1994 | Ogata | 327/116 |

FOREIGN PATENT DOCUMENTS

| | | |
|---|---|---|
| 0081750 | 12/1982 | European Pat. Off. . |
| 0102598 | 3/1984 | European Pat. Off. . |
| 0168330 | 1/1986 | European Pat. Off. . |
| 0220802 | 8/1986 | European Pat. Off. . |
| 0260632 | 3/1988 | European Pat. Off. . |
| 0292943 | 5/1988 | European Pat. Off. . |
| 0274606 | 7/1988 | European Pat. Off. . |
| 0363513 | 10/1988 | European Pat. Off. . |
| 0346896 | 6/1989 | European Pat. Off. . |
| 1221671 | 7/1966 | Germany . |
| 62-175011 | 7/1987 | Japan ........ 327/116 |
| 63-258112 | 10/1988 | Japan ........ 327/116 |
| 1152815 | 6/1989 | Japan ........ 327/116 |
| 1319321 | 12/1989 | Japan ........ 327/116 |
| 2143407 | 2/1985 | United Kingdom . |
| 8805236 | 7/1988 | WIPO . |

OTHER PUBLICATIONS

M.M.Mano, Computer Engineering Hardware Design, Prentice Hall, N.J, pp. 67–71, 1988.

IBM Technical Disclosure Bulletin, vol. 26, No. 3A, Aug. 1983, pp. 990,991, Hernandex, Jr., "Frequency Multiplier Using Delay Circuits".

*Primary Examiner*—Timothy P. Callahan
*Assistant Examiner*—T. T. Lam
*Attorney, Agent, or Firm*—Kerkam, Stowell, Kondracki & Clarke, P.C.; Edward J. Kondracki

[57] ABSTRACT

The frequency multiplier 10 is embodied by a phase-locked loop including a phase comparator 11 for commanding a plurality of delay elements 130 to 137 that furnish successive phase-shifted signals CL0–CL7 to a logical adder 16 made up of EXCLUSIVE OR gates.

13 Claims, 6 Drawing Sheets

PHASE-LOCKED LOOP AND RESULTING FREQUENCY MULTIPLIER

CROSS REFERENCE TO RELATED APPLICATIONS

This is a Continuation, of patent application Ser. No. 08/642,652, filed May 3, 1996, now abandoned, which is a continuation of Ser. No. 08/312,981 filed Oct. 3, 1994 which is now U.S. Pat. No. 5,548,235, which is a continuation of Ser. No. 08/046,179 filed Apr. 14, 1993, which is a continuation of Ser. No. 07/762,018 filed Sep. 18, 1991 which is now U.S. Pat. No. 5,260,608.

This application is related to the following co-pending applications of applicant:

U.S. 3213 "Method and System for Digital Transmission of Serial Data", U.S. Ser. No. 07/727,430 filed Jul. 9, 1991, corresponding to French 90.08811 filed Jul. 11, 1990.

U.S. 3214 "Apparatus for Serialization and Deserialization of Data and Resultant System for Digital Transmission of Serial Data", U.S. Ser. No. 07/727,429 filed Jul. 9, 1991, corresponding to French 90.08812 filed Jul. 11, 1990.

U.S. 3215 "Data Sampling Apparatus and Resultant Digital Transmission System", U.S. Ser. No. 07/727,843, filed Jul. 9, 1991, corresponding to French 90.08813 filed Jul. 11, 1990.

The subject matter of the aforenoted U.S. applications is hereby incorporated herein by reference.

DESCRIPTION

TECHNICAL FIELD OF THE INVENTION

The invention relates to a phase-locked loop and to a resulting frequency multiplier.

BACKGROUND

The conventional phase-locked loop is currently known by the acronym PLL. A PLL includes the following: a phase comparator for, receiving an input signal and a negative feedback signal; a filter connected to receive the output signal of the phase comparator; and a voltage controlled oscillator (VCO), which receives the output signal of the filter, furnishes the output signals of the PLL, and commands a negative feedback loop to produce the negative feedback signal to be applied to the phase comparator. The filter has a relatively low cutoff frequency relative to the frequency of the oscillator. The oscillator is generally one that generates free oscillations at a frequency controlled analogously for variation within a predetermined band of frequencies. With this PLL, a multiplier that multiplies the frequency by N is formed by inserting a divisor that divides the frequency by N into the negative feedback loop.

The use of a PLL has several major disadvantages. The first disadvantage is the relatively long time to obtain stable phase locking at the desired operating frequency of the PLL. This disadvantage arises at the moment the PLL is started up, or upon a change of the desired operating frequency of the PLL. The length of time to establish a stable PLL function is due to the presence of the negative feedback loop and depends on the electrical characteristics of the PLL. The most important characteristic is the value of the cutoff frequency of the filter with respect to the desired operating frequency of the PLL. The lower the cutoff frequency, the longer the establishment time. However, the lower the cutoff frequency of the filter, the better the phase-locking effectiveness. Consequently, a relatively major delay for establishment of correct operation of a PLL has to be allowed. Ordinarily this delay is on the order of several milliseconds and accordingly corresponds to the passage of numerous data that the PLL cannot process.

A second disadvantage of the use of a PLL is its sensitivity to induced electrical noise in the analog command signal of the VCO, which results in temporary instability (jitter) in the output frequency of the PLL.

A third disadvantage is that the operating frequency band of a PLL is relatively narrow, for two reasons. First, the two input signals of the phase comparator do not have the same phase or the same frequency. Making a comparator with a wide frequency bandwidth and phase range band proves to be quite difficult and very bulky in an integrated circuit. Secondly, it has been seen that the analog command of the oscillator is very sensitive to electrical noise Consequently, the noise occurring within a wide frequency band would cause very much major variations in frequency in the output signal and would compromise the operating stability of the PLL.

The analog phase command of the oscillator of a PLL also causes a fourth disadvantage. This disadvantage is thrown into an especially high relief in the following example. Currently, activating a transmission link in an integrated circuit causes relatively high heat dissipation, on the order of 0.5 W, for example. Consequently, if a large number of links (32, for example) is to be integrated, it is possible only to activate a small number (4 or 8). One method consists of making the other links dormant, and putting them to sleep and awaking them selectively to activate them. Since waking them must be done in a very brief time, all the adjustments appropriate for each link must be put digitally into memory. An analog phase command of a PLL thus prevents rapid wakeup of the liasons. This disadvantage increases with the aforementioned first disadvantage.

SUMMARY OF THE INVENTION

The present invention overcomes these disadvantages by providing a phase-locked circuit and a frequency multiplier having a short period for establishment of the correct PLL function, which are insensitive to electrical noise and applicable to a wide band of operating frequencies and are provided with digital control.

The invention provides a phase-locked loop, including a phase comparator receiving an input signal and a negative feedback signal, characterized in that the negative feedback signal is produced by a circuit for variable-phase delay of the input signal, the delay of which is commanded by the output signal of the phase comparator.

The result is a frequency multiplier according to the invention, including a phase-comparator adapted to receive an input signal and a negative feedback signal, characterized in that the negative feedback signal is produced by a delay circuit producing successive delays in the phase of the input signal, which delays are commanded by an output signal of the phase comparator, and that an output signal of the multiplier is furnished by a logical adder of the delayed signals.

BRIEF DESCRIPTION OF THE DRAWINGS

The characteristics and advantages of the invention will become clearly apparent from the ensuing description given by way of example, taken in conjunction with the accompanying drawings.

In the drawings.

DESCRIPTION OF THE PREFERRED EMBODIMENTS

Figure 1:
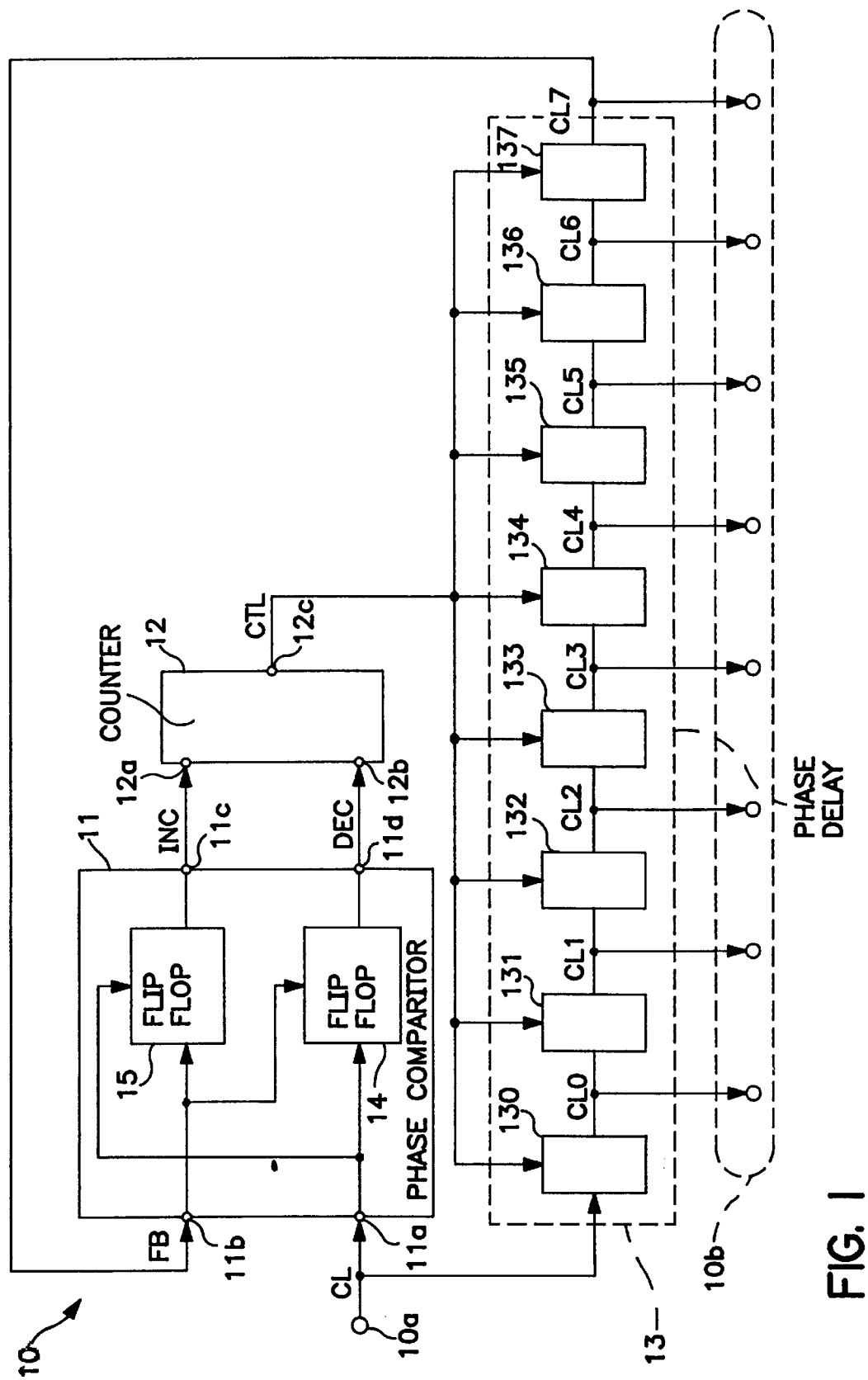
FIG. 1 schematically shows a phase-locked loop according to the invention.

FIG. 1 illustrates one preferred embodiment of a phase-locked loop 10 according to the invention. The circuit 10 includes the following: an input terminal 10a, a phase comparator 11, having a first input terminal 11a connected to the input terminal 10a of the circuit 10, a second input terminal 11b and two output terminals 11c, 11d; an up-down counter 12 having two input terminals 12a, 12b connected respectively to the output terminals 11c, 11d of the phase comparator 11 and one output terminal 12c; a phase delay circuit 13 composed of eight delay elements 130–137 connected in series between the two input terminals 11a and 11b of the phase comparator 11, and each provided with one command terminal connected to the output terminal 12c of the up-down counter 12; and one output 10b formed by the respective output terminals of the delay elements 130–137.

The phase comparator 11 is composed of two master-slave flip-flops 14 and 15 that are sensitive to the leading edges. The flip-flop 14 has its data input connected to the input terminal 11a, its clock input connected to the input terminal 11b, and its output connected to the output terminal 11d. Similarly, the flip-flop 15 has its data input connected to the input terminal 11b, its clock input connected to the input terminal 11a, and its output connected to the output terminal 11c.

Figure 2:
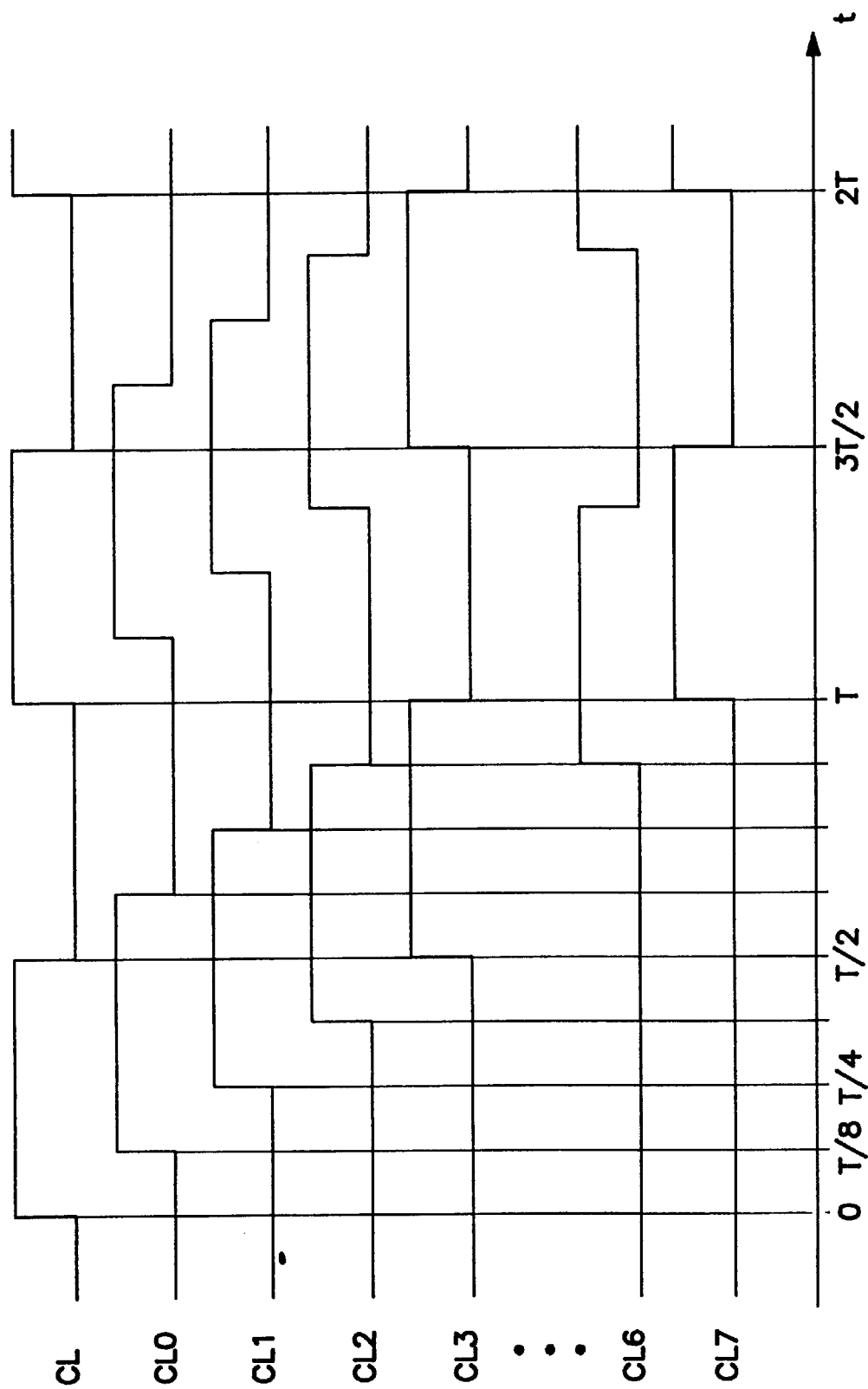
FIG. 2 shows various wave forms of sampled signals of the phase-locked loop shown in FIG. 1 in order to illustrate its function.

The input terminal 10a of the circuit 10 receives an input signal CL of given frequency, corresponding to a period T and ordinarily constituting a clock signal. FIG. 2 shows an example of the wave form of the input signal CL with respect to the time axis t. In FIG. 2, it is assumed that the input signal CL is applied at time t=0 to the input terminal 10a. FIG. 2 shows the wave forms of the output signals CL0, CL1, CL2, CL3, ..., CL6 and CL7 of the respective delay elements 130, 131, 132, 133, ..., 136 and 137 of the phase delay circuit 13. The signals CL0–CL7 are applied to the output terminal 10b of the circuit 10. The negative feedback terminal 11b of the phase comparator 11 receives the negative feedback signal FB constituted by the output signal CL7 of the delay circuit 13. The comparator 11 then compares the phase of the output signal CL7 with that of the input signal CL. The two output terminals 11c and 11d of the phase comparator 11 furnish an incrementation signal INC and a decrementation signal DEC, respectively. In response, the up-down counter 12 furnishes the command signal CTL applied to the delay elements 130–137. Each delay element, in a conventional manner, is composed of a predetermined number of elementary delay is applied to each delay element to cause it to vary the duration of the delay. The range of variation possible in the duration of the delay of a delay element in the course of a period T of the clock signal CL corresponds to a predetermined fraction 1/P of the maximum extent in the variation of the duration of a delay element. In other words, a given integral number P of periods T is needed to pass from one to the other of the extreme values of the maximum extent of variation of the delay of one element.

In operation, the input signal CL is delayed successively by the eight delay elements 130–137. The eight successive delays produced by the elements 130–137 are equal and in principle divide the period T of the input signal CL. If this is done precisely in practice, then the signals CL and FB (CL7) entering the phase comparator 11 and applied to the master-slave flip-flops 14 and 15 have the same phase and the same frequency. The signals DEC and INC furnished by the flip-flops 14 and 15 accordingly have the same logical value. The up-down counter 12 is then not activated and leaves the command signal CTL unchanged. All the output signals CL0–CL7 are correctly out of phase with respect to one another and with respect to the input signal CL, by the same value T/8. In practice, a margin of tolerance m of the phase displacement between the input signal CL and the negative feedback signal FB=CL7 is determined. A phase displacement within the margin m leaves the signals INC and DEC unchanged and is accordingly not likened to a phase displacement requiring correction. The margin m may be determined by the establishment times of the flip-flops 14 and 15 and/or by the relative delays between the data input and clock input signals of each flip-flop, for example. The width of the margin m determines the precision of the phase comparison performed by the comparator 11. Typically, it is on the order of 50 ps for a period T=5 ns of the input signal CL.

If the negative feedback signal FB leads the input signal CL in phase, then the decrementation signal DEC has the logical value of 0, and the incrementation signal has the value 1. The up-down counter 12 is then incremented so that the command signal CTL consequently and in an equal manner increases the durations of the delays produced by the elements 130–137. On the other hand, if the negative feedback signal FB lags behind the input signal CL, then the incrementation signal INC has the value 0 and the decrementation signal DEC has the value 1. The up-down counter 12 is decremented so that the command signal CTL will shorten the durations of the delays produced by the elements 130–137 equally. Consequently, any phase displacement beyond the margin of tolerance m is corrected for all the delay elements 130–137, in order to re-establish the desired phase displacements.

The digital phase command used in the phase-locked loop 10 according to the invention offers one major advantage. If the input signal CL is interrupted, the negative feedback signal FB is interrupted as well, on principle. The flip-flops 14 and 15 of the phase comparator 11 accordingly no longer receive any signal at their clock input and thus each of them maintains the last transmission state. Similarly, the up-down counter 12 maintains its state, and consequently the state of the delay elements 130–137. In other words, the circuit 10 according to the invention maintains the last state of the transmission. It follows that the reappearance of the first edge of the input signal CL will immediately produce the correct output signals CL0–CL7, if the frequency of the input signal CL has not changed. Otherwise, the delays are adjusted by the up-down counter 12 upon the second cycle of the input signal CL, in order to produce the desired output signals CL0–CL7. In conclusion, the duration for establishment of correct operation of a phase-locked loop according to the invention may be 0, or at worst equal to the aforementioned number P of periods T of the input signal for passing between the two extreme values of the extent of variation of the duration of each delay element. Consequently, the startup of the circuit according to the invention, or the wakeup of a transmission line, transpires in a very brief time.

A second major advantage is the wide band of operating frequencies of the phase-locked loop according to the invention. The width of the band depends essentially on the range of variable delays of each delay element 130 to 137, as will become apparent hereinafter with reference to the frequency multiplier according to the invention.

Another great advantage is that the input signal CL and the negative feedback signal FB which are compared by the phase comparator 11 have the same frequency in principle. The structure of the comparator 11 may be quite simple, like that shown. Furthermore, the comparator can accommodate a wide band of operating frequencies. In summary, the invention solves all the aforementioned problems that the use of a conventional PLL presents. Another advantage offered by a circuit 10 according to the invention resides in its adaptation to the various forms of the input signal. In the example shown, the cyclic ratio (mark to space) of the input signal can be arbitrary.

Numerous variants in embodiment may be made in the circuit 10 described and shown. In particular, it is clear that the delay circuit 13 may have any number N of delay elements. At the outside, the delay circuit 13 may be made of a single variable delay element. In that case, the circuit 10 could for example serve as a device for phase-shifting by one period T of an input signal CL that can vary within a very wide band of frequencies. Also, the delay elements 130 to 137 may have some other structure than that described above. For example, delay elements corresponding to the transit time of a logic gate are known. The transit time is commanded by the current intensity passing through the gate, or by the value of the charge applied to the gate. In that case, the up-down counter 12 would have to be replaced with a command device suitable for the operation of such delay elements. The general principle of the invention is accordingly that the delay circuit 13 is commanded by the output signal of the phase comparator 11. The advantage of the up-down counter 12 and the delay elements 130–137 described resides in particular in their structural and functional simplicity, their reliability, and their adaptation to the phase comparator described. The advantages of this comparator have been seen. It is understood that other structures are possible and may be better adapted to those of the command device 12 for the delay circuit 13.

Figure 3:
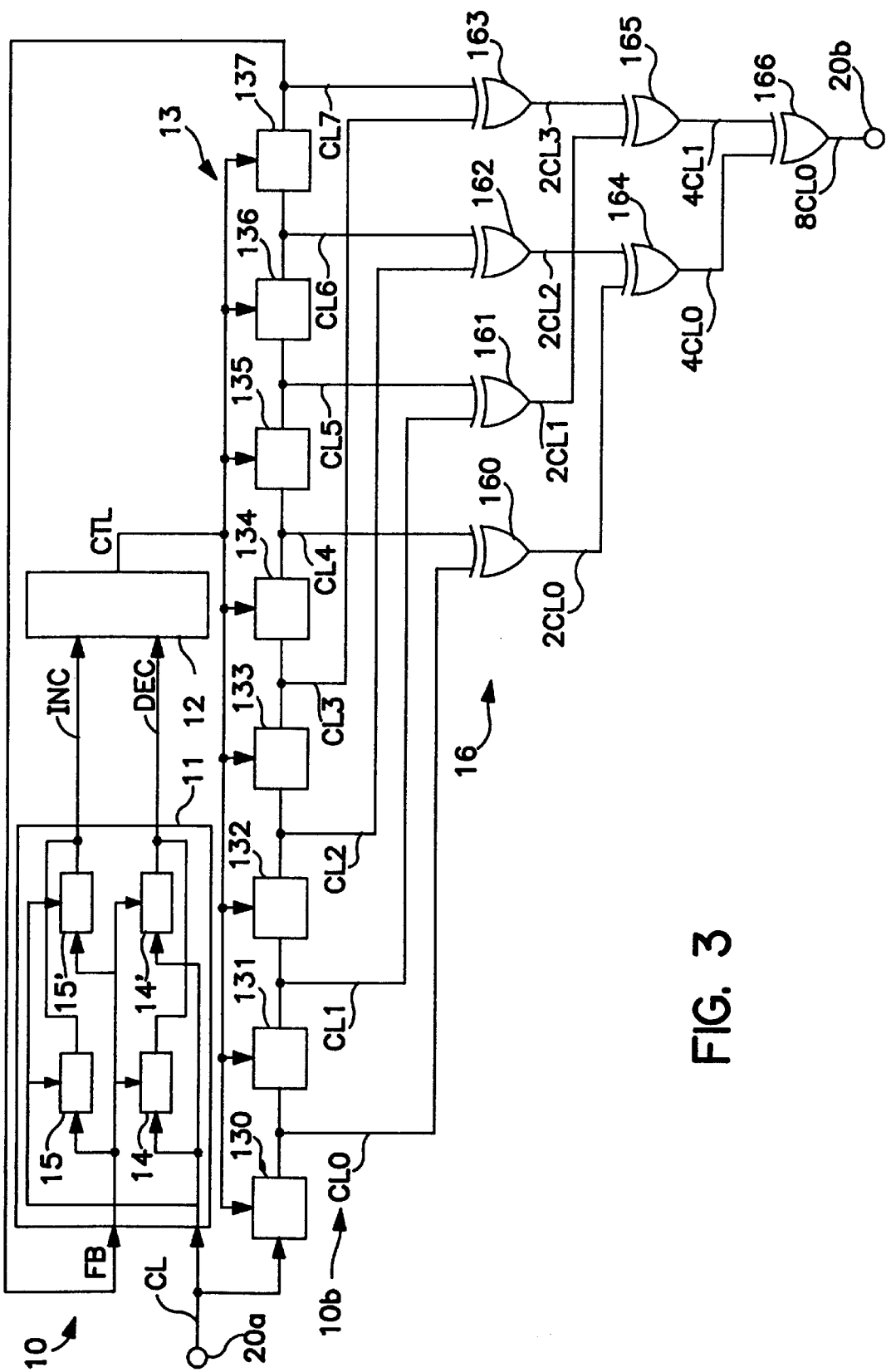
FIG. 3 schematically shows a frequency multiplier according to the invention resulting from the employment of the phase-locked loop shown in FIG. 1.
Figure 4:
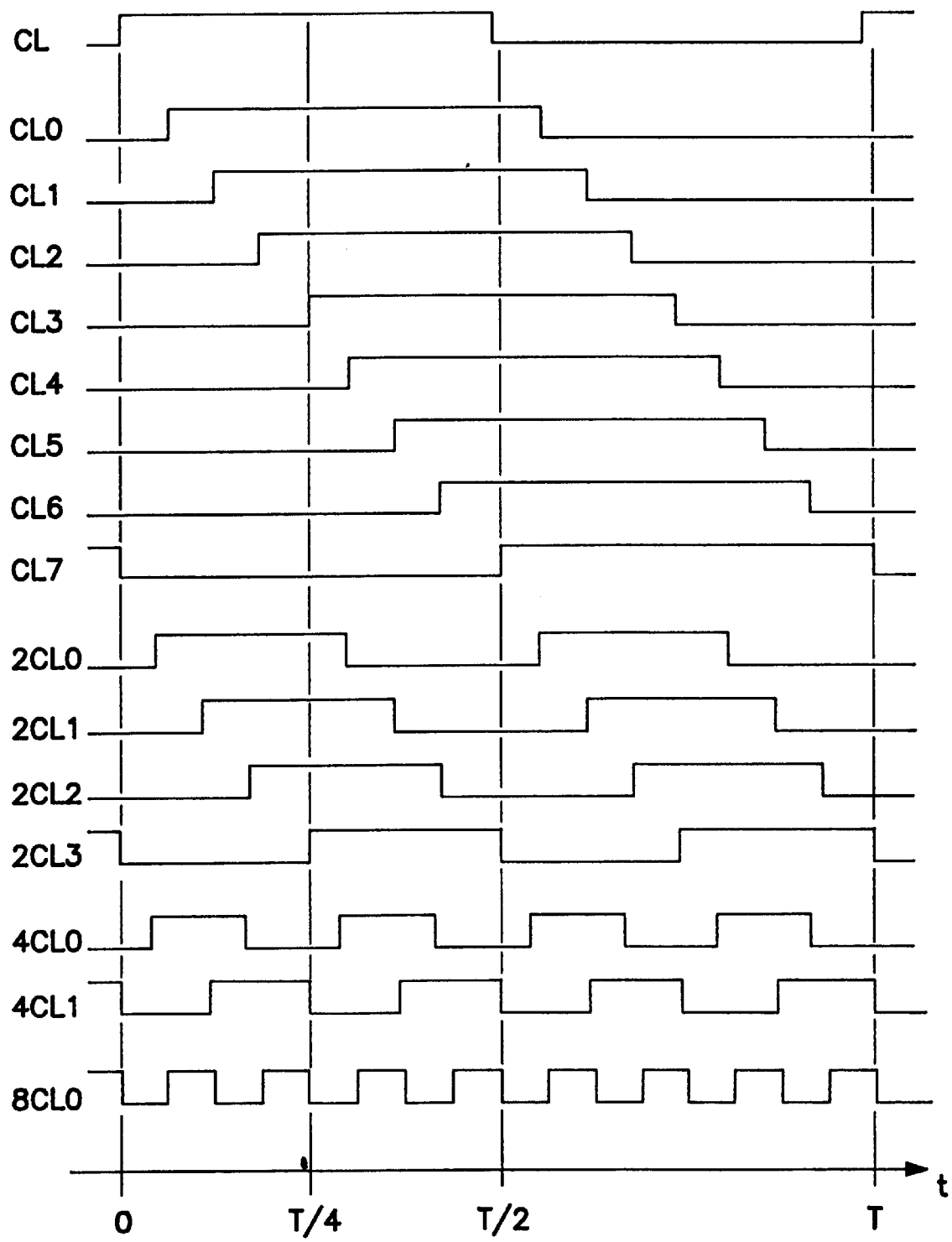
FIG. 4 shows various wave forms of sampled signals of the frequency multiplier shown in FIG. 3, to illustrate its function.

FIG. 3 shows a frequency multiplier 20 according to the invention, employing the phase-locked loop 10 shown in FIG. 1. The multiplier 20 simply includes the circuit 10, the input terminal 10a of which constitutes the input terminal 20a of the multiplier 20, and the output 10b of which is connected to the input of a logical adder 16. The output of the adder 16 constitutes the output terminal 20b of the frequency multiplier 20. FIGS. 3 and 4 show a variant use according to the invention of the phase-locked loop 10. In this variant, the phase comparator 11 incorporates two master-slave flip-flops 14', 15', which trip at the trailing edge of the input signal CL. The flip-flops 14' and 15' are disposed in the same way as the flip-flops 14 and 15 that trip at the leading edges of the input signal CL. With this variant, the phase comparison is done every half-period T/2 of the input signal CL. Consequently, the output signals CL0–CL7 are successively offset with respect to each edge of the square input signal CL by a duration T/16 produced by each delay element 130–137.

The adder 16 is made in a conventional manner of a tree circuit of seven EXCLUSIVE OR gates 160–166 each with two inputs. The four gates 160–163 receive the output signals CL0 and CL4, CL1 and CL5, CL2 and CL6 and CL3 and CL7, respectively. The gates 160–163 furnish the output signals 2CL0–2CL3, respectively, shown in FIG. 4. The signals 2CL0–2CL3 are square and have a frequency twice that of the input signal CL. The gates 164 and 165 respectively receive the output signals of the gates 160, 162 and 161, 163, and they furnish the signals 4CL0 and 4CL1 shown in FIG. 4. The signals 4CL0 and 4CL1 are square, having a frequency four times that of the input signal CL. Their application to the last gate 166 furnishes the output signal 8CL0 at the output terminal 20b of the multiplier 20. As shown in FIG. 4, the signal 8CL0 is square and has a frequency eight times that of the input signal CL.

In practice, embodying the logical adder 16 in the form of integrated circuits dictates assigning equal propagation times between the outputs of the delay elements 130 to 137 and the output 20b of the adder. This constraint assures the quality of the multiple frequency. On the other hand, using the adder 16 as shown requires phase displacements of T/16 between the signals CL and CL0–CL7. In the multiplier 20 receiving a square input signal, these phase displacements are produced simply by eight delay elements, adjusted each half period T/2, after phase comparison in the comparator 11.

The frequency multiplier 20 benefits from all the advantages of the phase-locked loop 10 and those of the logical adder. Those that can be mentioned in particular are simplicity, reliability, and adaptation to a wide band of operating frequencies. For example, with an input signal CL of period T varying between 5 ns and 10 ns and with a delay circuit 13 having 10 delay elements each capable of producing a delay varying from 250 to 500 ps, it is possible to obtain a frequency within a range from 1 to 2 GHz at the output of a frequency multiplier according to the invention.

Besides the variant embodiments mentioned in conjunction with the phase-locked loop 10, all the well-known variant embodiments of the logical adder 16 are also possible. It is equally clear that the multiplication factor depends on the number N of delay elements in the delay circuit 13, on the operation of the phase-locked loop 10, and on the structure of the logical adder 16. For example, the two flip-flops 14' and 15' could be dispensed with in the phase comparator 11, and the phase comparison could be done upon each period T after two passages in the elements 130 to 137. If the input signal CL is not square, it would be possible for example to dispose 16 delay elements in the circuit 10 of FIG. 1, or to add an interface between the circuit 10 and the logical adder 16 in the frequency multiplier 20.

Figure 5:
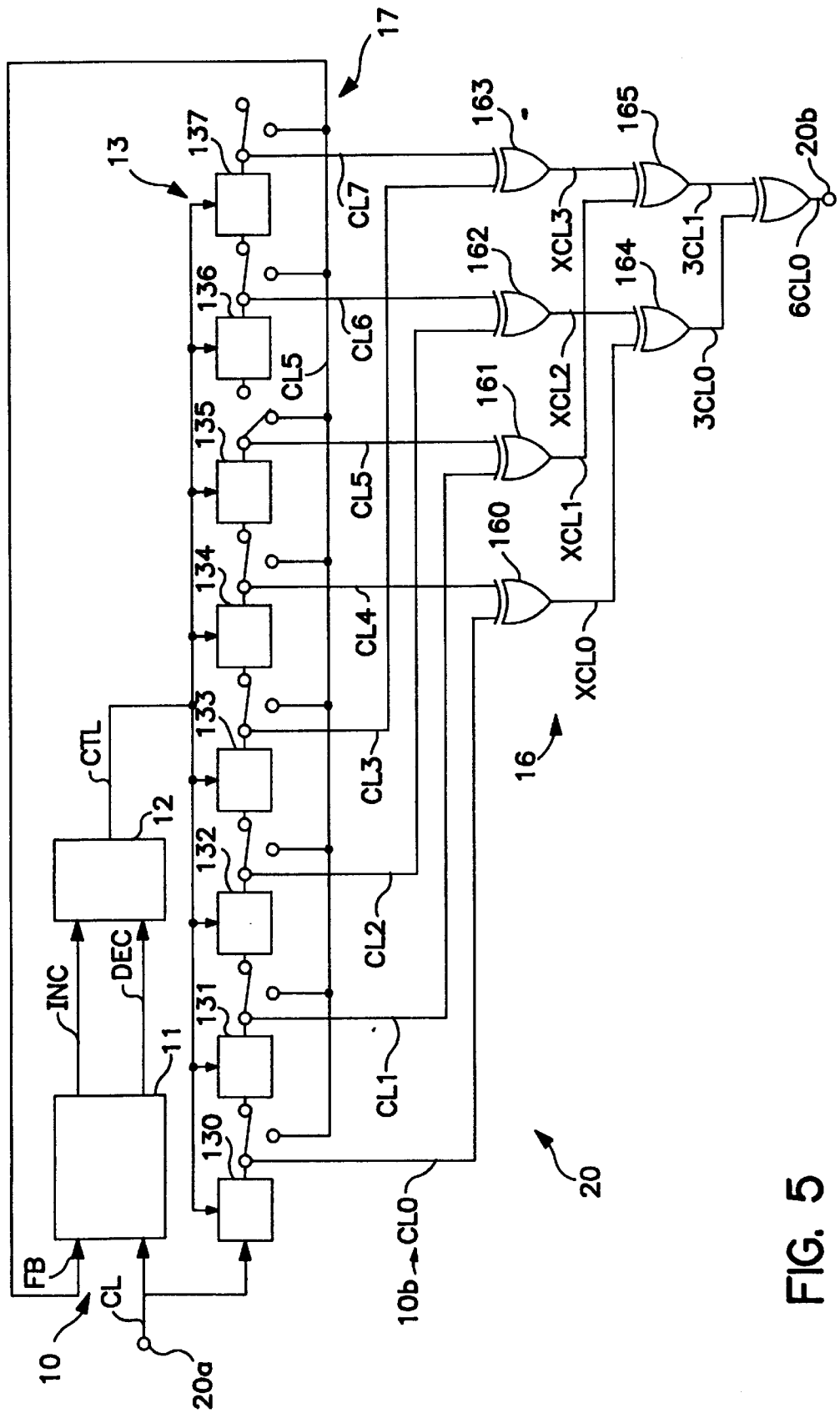
FIG. 5 schematically shows a variant embodiment of a frequency multiplier according to the invention.
Figure 6:
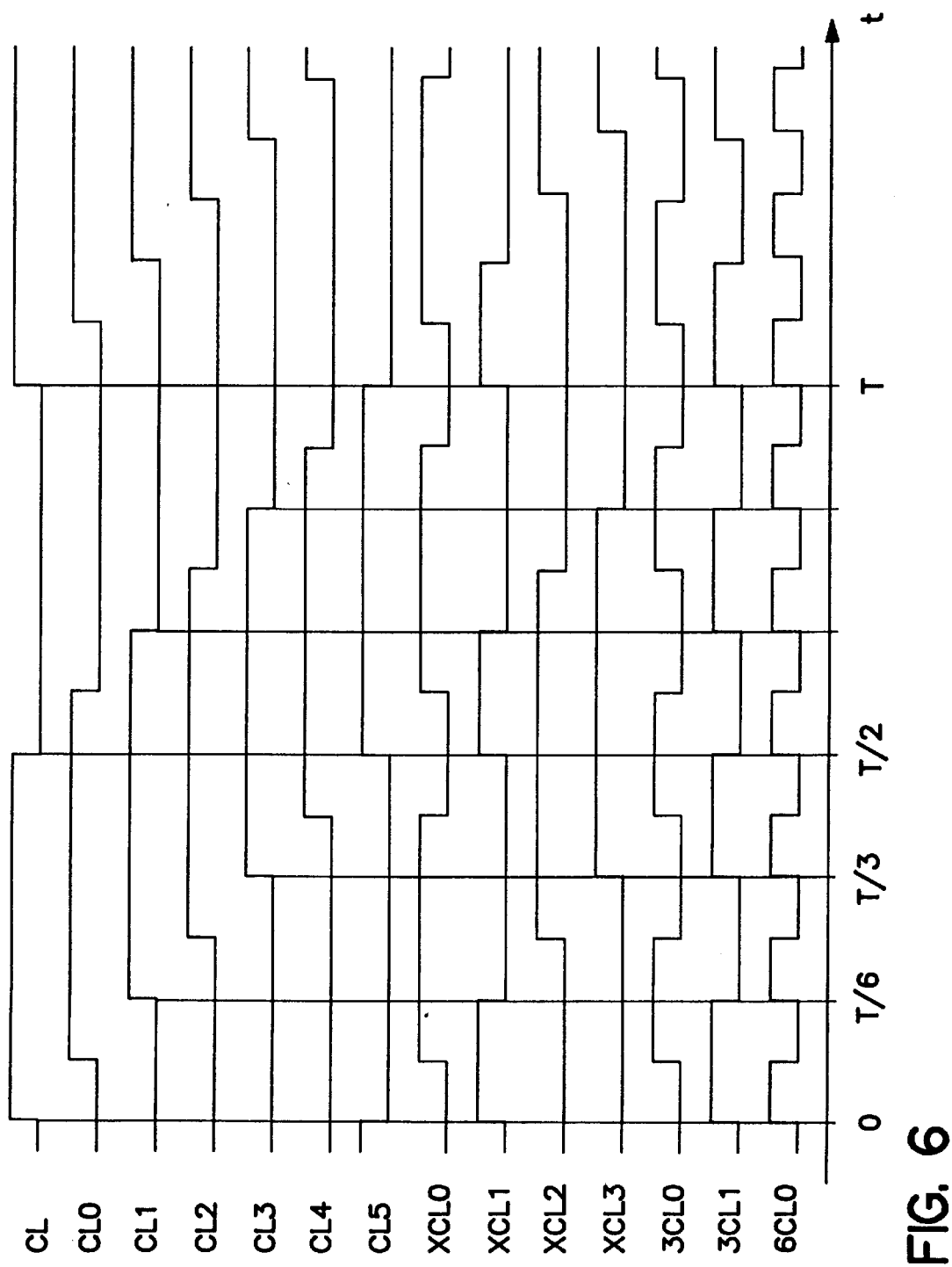
FIG. 6 shows wave forms of sampled signals of the frequency multiplier shown in FIG. 5, to illustrate its function.

FIG. 5 schematically shows a variant embodiment of the frequency multiplier 20 in the form of a multiplexed multiplier 20'. All the components have the same structure as that described above with respect to FIG. 3. In other words, the phase-locked loop 10 furnishes all the output signals of the eight delay elements 130–137 to the logical adder 16. The only difference in this variant embodiment from that shown in FIG. 3 is in the addition of a selection device, such as a multiplexer 17, and in the adaptation to the multiplexer of the links between the delay elements 130–137. The multiplexer 17 furnishes the negative feedback signal FB to the negative feedback input of the phase comparator 11. The inputs of the multiplexer 17 are shown schematically as switches connecting the delay elements to one another and associated with the line that furnishes the negative feedback signal FB. The advantage of the multiplexer 17 is that the multiplication factor of the multiplexed frequency multiplier 20' can be varied. In the example selected and shown in FIGS. 5 and 6, the multiplexer 17 maintains the linkage of the first six delay elements 130–135 in order to sample the negative feedback signal FB at the output of the element 135 (FB=CL5) The delay elements 136 and 137 are kept separate by the multiplexer 17 but their respective outputs remain connected to the adder 16 and furnish it with a fixed, predetermined logical value. FIG. 6 shows the wave forms of the signals sampled under these conditions of the multiplexed frequency multiplier 20'. The signals CL0–CL7 are successively delayed by the duration T/16 with respect to the input signal CL. The gates 160 to 163 furnish intermediate signals XCL0–XCL3 to the gates 164 and 165. With respect to the frequency of the input signal CL, that of the output signals 3CL0 and 3CL1 of the gates 164 and 165 is triple, and that of the signal 6CL0 of the terminal 20c is six times as high. Certainly one skilled in the art can avail himself of other variant embodiments of a selection device to obtain a desired multiplication factor of a frequency multiplier according to the invention.

I claim:

1. A frequency multiplier system comprising equally phase-shifted input signals of an identical frequency and a tree of gates each of the Exclusive-OR type and each having two inputs and one output, said tree having at least three levels of gates including an input level of gates for receiving said phase shifted input signals on respective inputs thereof, an intermediate level of gates for receiving first output signals of the input level of gates on respective inputs thereof, which first output signals are a frequency multiple of said identical frequency of said phase shifted input signals, and providing second output signals which are a frequency multiple of the first output signals, and an output level of one gate receiving the second output signals of said intermediate level of gates and providing a third output signal which constitutes the output of said frequency multiplier system and which is a frequency multiple of said second output signals, two of said outputs of said gates of said input level of gates, being connected to the inputs of one of said gates in the intermediate level, said outputs of said intermediate level of gates being connected to the inputs of said output level gate, and each of said phase shifted input signals to said input level of gates flowing through an equal number of said gates at each level to provide said output signal of said frequency multiplier.

2. The system of claim 1, wherein the delays of said phase shifted input signals share a period of said identical frequency.

3. The system of claim 1, wherein the first output signals of the input level of gates are twice the frequency of the phase shifted input signals of identical frequency.

4. The system of claim 3, wherein the second output signals of the intermediate level of gates are twice the frequency of the first output signals of the input level of gates.

5. The system of claim 4, wherein the third output signal has a frequency which is twice the frequency of the second output signals at the intermediate level of gates.

6. A frequency multiplier system as set forth in claim 1, wherein each input level gate receives on its inputs a first signal and a second signal, the second signal being delayed from the first signal by a predetermined increment.

7. A frequency multiplier system comprising a tree of gates each of Exclusive-OR type and having two inputs and one output, said gates being arranged in at least three levels including an input level, an intermediate level and an output level, said gates of said input level receiving input signals on respective inputs thereof, said input signals having a period corresponding to a predetermined frequency and being successively delayed therebetween to share said period, said gates of said intermediate level receiving first output signals from said input level gates on respective inputs therefore, said first output signals being of a frequency which is a multiple of said input signals and said output level gate having its inputs connected to receive second output signals from said intermediate level gates generating a third output signal which is the output of said frequency multiplier system having a frequency multiple of said predetermined frequency of said input signals.

8. The system of claims 7, wherein each of said input signals flowing through an equal number of said gates to provide said output signal of said frequency multiplier.

9. The system of claim 7, wherein the first output signals of the input level of gates are twice the frequency of the input signals of identical frequency.

10. The system of claim 9, wherein the second output signals of the intermediate level of gates are twice the frequency of the first output signals of the first input level of gates.

11. The system of claim 10, wherein the third output signal has a frequency which is twice the frequency of the second output signals at the intermediate level of gates.

12. The system of claim 11, wherein the first output signals of the input level of gates are twice the frequency of the input signals of identical frequency.

13. A frequency multiplier system as set forth in claim 7, wherein each input level gate receives at its inputs a first signal and a second signal, the second signal being delayed from the first signal by a predetermined increment.

* * * * *